United States Patent [19]
Tanaka et al.

[11] 4,380,732
[45] * Apr. 19, 1983

[54] SIGNAL SPECTRUM DISPLAY APPARATUS

[75] Inventors: Yoshiaki Tanaka, Tokyo; Mamoru Inami, Yokohama, both of Japan

[73] Assignee: Victor Company of Japan, Ltd., Yokohama, Japan

[ * ] Notice: The portion of the term of this patent subsequent to Dec. 22, 1998, has been disclaimed.

[21] Appl. No.: 180,502

[22] Filed: Aug. 22, 1980

[30] Foreign Application Priority Data

Aug. 24, 1979 [JP] Japan .................... 54-107768

[51] Int. Cl.³ .................................... G01R 23/16
[52] U.S. Cl. .......................... 324/77 D; 324/77 E
[58] Field of Search .................... 324/77 D, 77 E

[56] References Cited

U.S. PATENT DOCUMENTS

| | | | |
|---|---|---|---|
| 3,236,947 | 2/1966 | Clapper | 324/77 E |
| 4,045,767 | 8/1977 | Nishihara | 324/77 E |
| 4,307,340 | 12/1981 | Tanaka | 324/77 E |

*Primary Examiner*—Michael J. Tokar

*Attorney, Agent, or Firm*—Michael N. Meller; Anthony H. Handal

[57] ABSTRACT

A signal spectrum display apparatus comprises a plurality of band-pass filters respectively having filtering bands of different center frequencies and operating to filter an input signal thereby to band-divide the input signal fed through an input terminal a plurality of rectification and charging circuits connected respectively to said band-pass filters, a display section having displaying systems of the same number as the band-pass filters respectively corresponding to the band-pass filters and for displaying the outputs of the rectification and charging circuits, and a switch connected between a point between the rectification and charging circuit and the display section, and the ground.

A capacitor of the rectification and charging circuit charges and discharges during said switch is closed, whereby the input signal level is displayed in real-time in the display section, and stops charging and discharging during the switch is opened, whereby the maximum input signal level is successively displayed in the display section in response to the output voltage held in response to successive higher input signal voltage.

8 Claims, 6 Drawing Figures

SIGNAL SPECTRUM DISPLAY APPARATUS

BACKGROUND OF THE INVENTION

The present invention relates generally to signal spectrum display apparatuses and more particularly to a signal spectrum display apparatus in which the real-time level display, the holding level display, and the like can be selectively carried out, respectively, on a display panel by a simple switch operation.

In general, in the recording of an audio signal, it is desirable in some instances to carry out the signal recording with the levels of the desired frequency bands in which these signals exist in lowered or raised state. In the reproducing apparatus, furthermore, in the case where the fidelity of the reproduced audio signal is impaired by the effects of characteristics such as the frequency characteristics possessed by the speakers, pickup cartridge, and other acoustical devices themselves and the transmission characteristic of the listening room, it is desirable in some instances to correct the levels of signals of certain frequency bands. In addition, there are instances wherein, for both recording and reproducing, the frequency characteristics are not made flat but are transformed into desired characteristics. In such cases, a graphic equalizer capable of variably adjusting signal level is used for each of the divided frequency bands.

For adjusting the level in the graphic equalizer of this type a signal spectrum display apparatus is used, which displays the level of the input signal in all bands, and the signal levels in different frequency bands.

However, since the level of the input signal varies from time to time, moment by moment, it is considerably difficult to accurately perceive the state of the level at a certain instant of time. Accordingly, in order to perceive the state of the level at any one instant of time, it is necessary that the display of the state of the level at that instant be stopped. Thus, in a known spectrum display apparatus, the input signal is shifted by means of a shift register of 100 bits, for examply, and this is digitally held and supplied to a display drive circuit thereby to carry out level displaying for each of the divided bands.

This known spectrum display apparatus has disadvantages in that it simply displays the input signal level at real-time, or displays the held and stopped signal level, thus not being able to display the maximum level of the input signal spectrum. Furthermore, a man cannot know the tendency of the frequency characteristics of the input signal.

In this known apparatus, the stopping of the level display is accomplished by holding the shift register. For this reason, after the level display has been once stopped, this state of display is preserved. As a consequence, when normal displaying in accordance with the level variations occuring from time to time, moment by moment is resumed, it has been necessary to terminate the stopped state of the display by operating a switch each time. For this reason, the operation of the apparatus has been very troublesome. Furthermore, since a shaft register is used in this known apparatus, in the case where the number of the display elements is increased in order to display the level state in an even finer manner, the number of bits of the shift register must be increased, and problems such as higher cost of production arise.

SUMMARY OF THE INVENTION

Accordingly, it is a general object of the present invention to provide a novel and useful spectrum display apparatus in which the above described difficulties encountered in the prior apparatus have been overcome.

Another and specific object of the invention is to provide a signal spectrum display apparatus in which switching means is provided between a point between the rectification and charging circuit and the level display section, and the ground. The input signal level is displayed in real-time in the closed state of the switching means, and the input signal level is held by the rectification and charging circuit whereby the held level is displayed in the open state of the switching means. During the display of the held level, the new maximum level of the input signal is successively held and displayed. According to the apparatus of the present invention, the real-time level display and the held holding level display can be selectively performed, by simple circuit construction and simple switching operation.

Still another object of the invention is to provide a signal spectrum display in which switching means is further provided to interrupt the input signal at a stage before a plurality of band-pass filters which separate the input signal into a plurality of bands, in addition to the above mentioned switching means. The fixed holding level is displayed since the input signal is interrupted during the display of the holding level.

A further object of the invention is to provide a signal spectrum display apparatus in which a mode for displaying the level in real-time, a mode for successively displaying the new maximum holding level, and a mode for displaying the fixed holding level is selectively displayed on a signal spectrum display section.

Other objects and further features of the invention will be apparent from the following detailed description when read in conjunction with the accompanying drawings.

DETAILED DESCRIPTION

Figure 1:
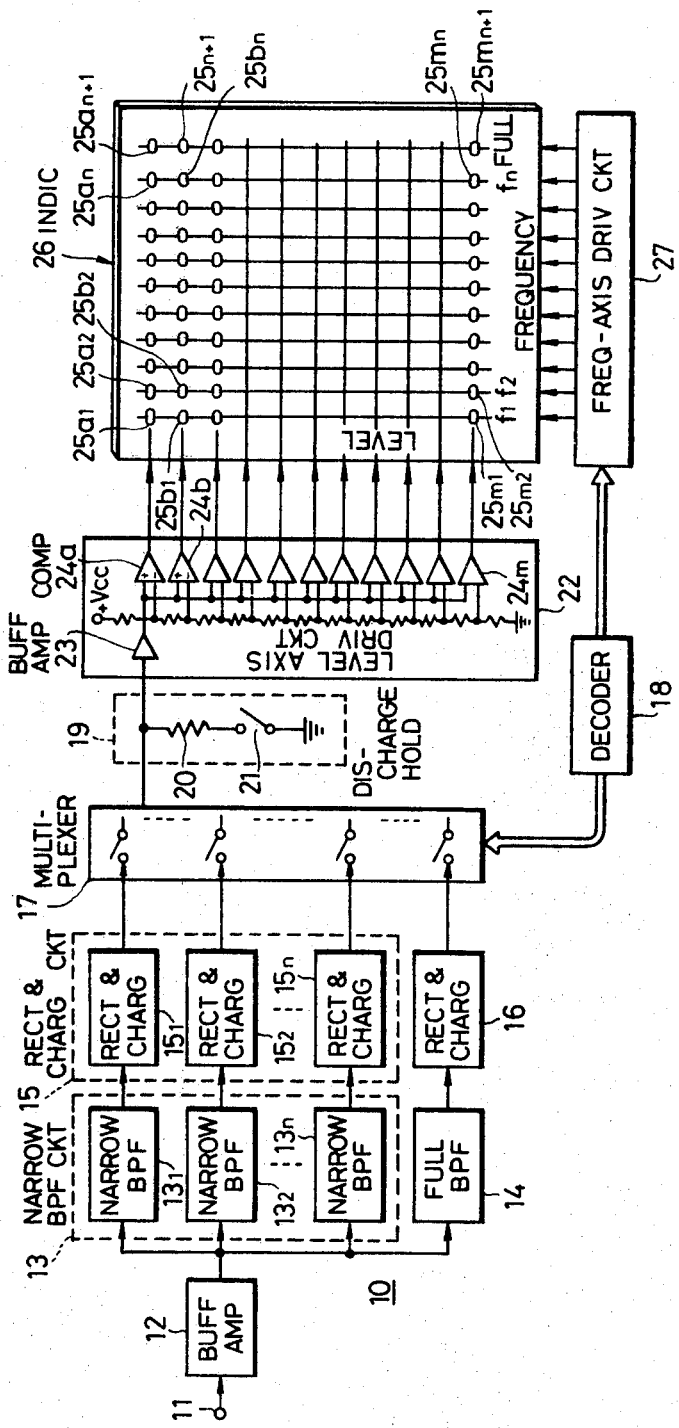
FIG. 1 is a block circuit diagram of a first embodiment of the signal spectrum display apparatus of the present invention.
Figure 3:
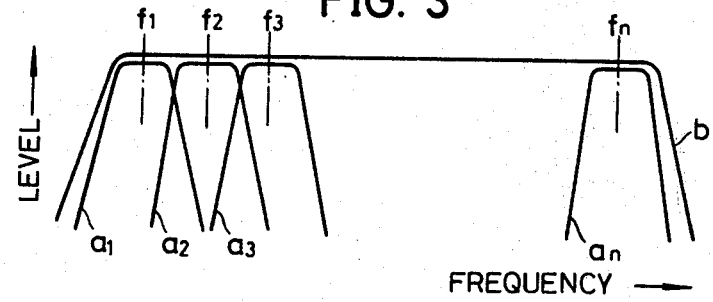
FIG. 3 is a characteristic diagram showing the frequency of filter circuits in the block diagram of FIG. 1.

The block circuit system of a first embodiment of the spectrum display apparatus according to the present invention will first be described in conjunction with FIG. 1. In this spectrum display apparatus 10, an audio signal introduced thereinto through an input terminal 11 is fed through the buffer amplifier 12 to a narrow bandpass filter circuit 13 comprising n narrow band-pass filters $13_1$ through $13_n$ and a full band-pass filter 14. As indicated in FIG. 3, the narrow band-pass filters $13_1$ through $13_n$ respectively have narrow band-pass filtering characteristics a1 through an for filtering narrow bands respectively having different center frequencies f1 through fn. The full band-pass filter 14 has a full band-pass filtering characteristic b for filtering the entire band of the input audio signal.

Figure 2:
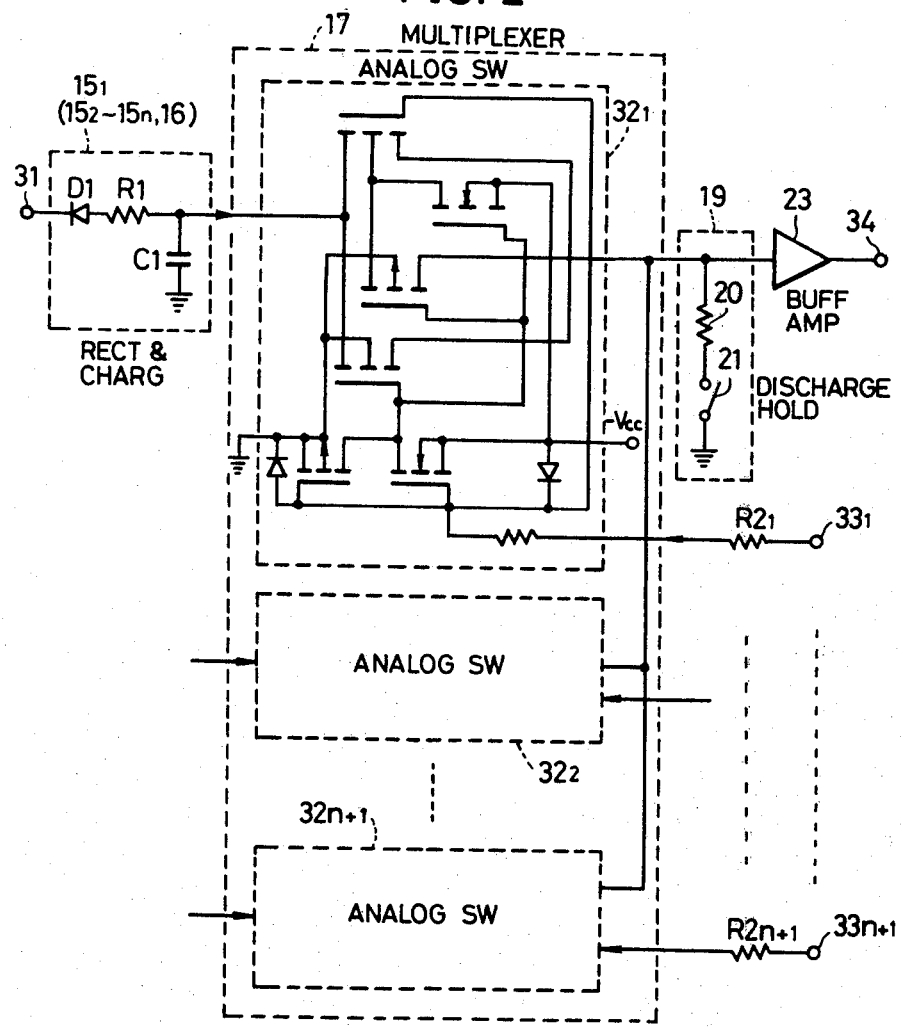
FIG. 2 is a circuit diagram of one embodiment of a concrete circuit construction of an essential part of the block circuit diagram of FIG. 1.

The signal components which have been filtered and band divided by the filters $13_1$ through $13_n$ and the full band signal produced as output from the filter 14 are respectively supplied to a rectification and charging circuit 15 comprising rectifying and charging circuits $15_1$ through $15_n$ and to a rectifying and charging circuit 16, where they are rectified and charged. The rectification and charging circuits $15_1$ ($15_2$ through $15_n$, and 16) comprises, for example, a diode $D_1$, restistor $R_1$, and capacitor $C_1$ which charges and discharges, as shown in FIG. 2.

The output signals of the rectification and charging circuits 15 and 16 are fed to a multiplexer 17.

Figures 4, 5:
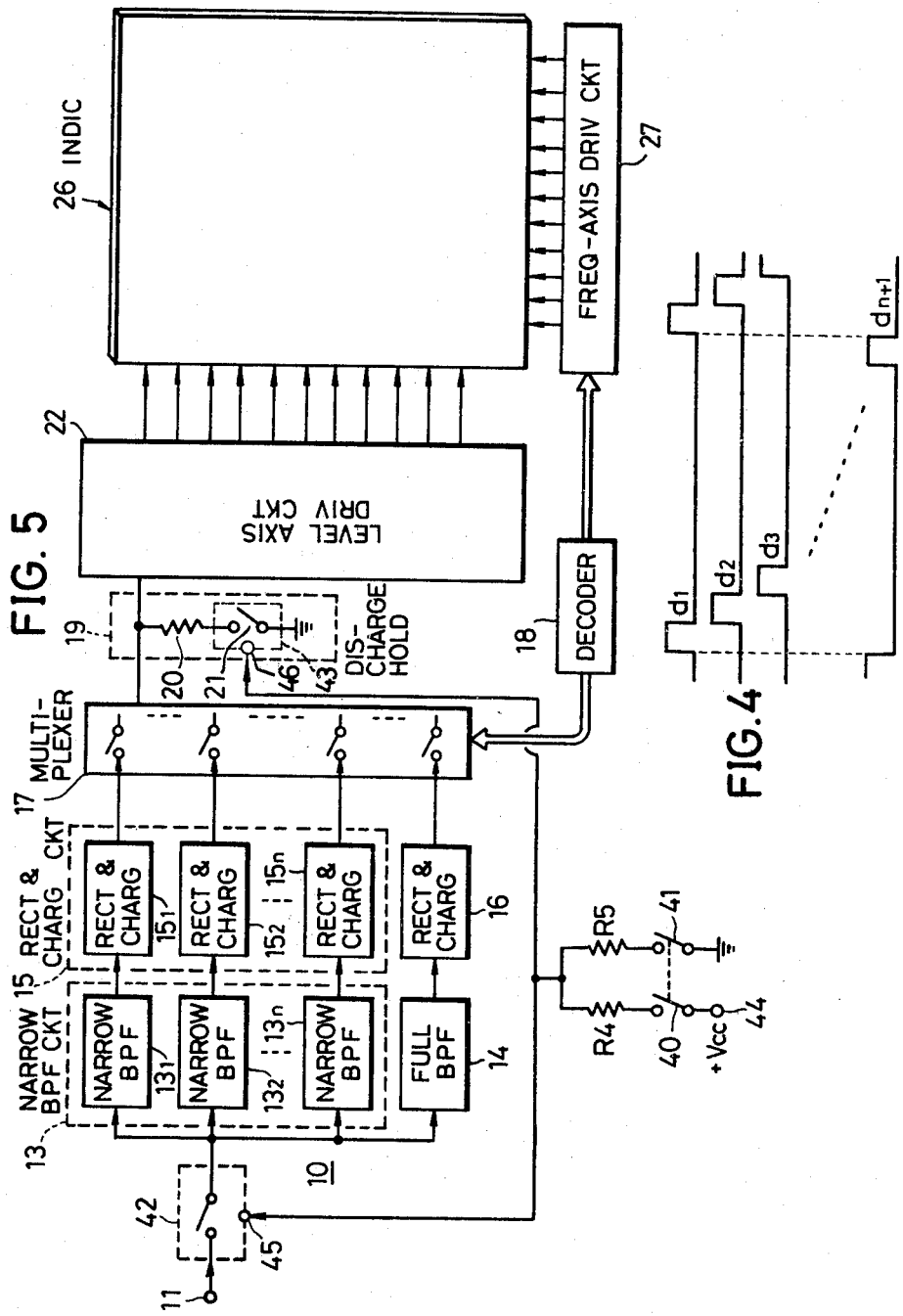
FIG. 4 is a graph indicating the waveforms of the output signal of a decoder in the block diagram of FIG. 1.
FIG. 5 in a block diagram showing a second embodiment of the signal spectrum display apparatus of the present invention.

This multiplexer 17 is supplied successively with decoded pulses d1 through dn+1 of (n+1) notation of timing waveforms as shown in FIG. 4 from a decoder 18 and successively and serially subjects the signal components from the rectification and charging circuits $15_1$ through $15_{n+1}$ and 16 to time division. The resulting signal thus time-divided is fed through a discharge holding circuit 19 to a level axis (vertical axis) driving circuit 22. The discharge holding circuit 19 comprises a resistor 20 and a switch 21. The resistor 20 and the switch 21 are connected in series between a point between the multiplexer 17 and the level axis driving circuit 22, and the ground. For displaying the spectrum of the signal in real-time, the switch 21 is closed. In this driving circuit 22, the time-divided signal is supplied through a buffer amplifier 23 to the input terminals on one side of comparators 24a through 24m connected in parallel. Reference voltages for comparison of respectively different magnitudes resulting from the division of a positive-voltage power source +Vcc by respective resistors are applied to the other input terminals of the comparators 24a through 24m. The output sides of the comparators 24a through 24m are respectively connected to level-displaying elements 25a1 through 25an+1, 25b1 through 25bn+1, . . . , 25m1 through 25mn+1 respectively in horizontal rows of a display section 26.

In the display section 26, the respective systems of the level-displaying elements 25a1 through 25m1, 25a2 through 25m2, . . . , 25an through 25mn are respectively arranged in vertical rows or columns so as to display respectively the signal levels of frequency bands a1, a2, . . . an respectively of center frequencies f1, f2, . . . fn. The level-displaying elements 25an+1 through 25mn+1 are vertically arranged so as to display the signal level of the full frequency band b.

The aforementioned decoder 18 supplies the same decoded pulses d1 through dn+1 as supplied to the multiplexer 17 to a frequency-axis (horizontal axis) driving circuit 27, which operates in response thereto to drive successively and time divisionally the level-displaying element groups 25a1 through 25m1, 25a2 through 25m2, . . . , 25an through 25mn, 25an+1 through 25mn+1 and to place the same in operable state.

Accordingly, under normal conditions, the bandpassed signals which have been filtered by the narrow band-pass filters $13_1$ through $13_n$ and the full band-pass filter 14 are subjected to time division by the multiplexer 17 and successively supplied to the level axis driving circuit 22. Thereupon outputs corresponding to the levels of the signals higher than the comparison reference voltages are led out from the comparators. As a result, the level-displaying elements corresponding to the bands similarly time divided and driven become lit. Strictly speaking, a level-displaying element is extinguished by time division and driving. However, when the frequency of the decoder pulses has been selected at a value of the order of 100 Hz, the level-displaying element appears to be continuously lit because of the after-image or visual-persistence effect of the human eye. By the above described operation, the variations of the signal levels respectively of the bands a1 through an are displayed from time to time and noment by moment inreal-time by the level-displaying element groups 25a1 through 25m1, . . . 25an through 25mn. Similarly, the variation of the level of the full band-passed signal is displayed by the level-displaying element group 25an+1 through 25mn+1.

In the state where the signal level is displayed in real-time as described above, upon opening of the switch 21 of discharge holding circuit 19, the capacitor $C_1$ of the rectification and charging circuit stops charging and discharging, and the output voltage is held. During this time, as shown in FIG. 2, the signal voltage supplied to a terminal 31 from the land-pass filter 13, ($13_2$-$13_n$) is applied to the capacitor $C_1$ through the diode $D_1$ and resistor $R_1$ from time to time and moment to moment. The voltage across the capacitor $C_1$ is successively held at the new maximum voltage level larger than the past maximum voltage level of the input signal. This display of the maximum level is performed during the open state of the switch 21. Accordingly, accompanying the variation of the level of the input signal, the maximum level to the present time can be easily observed. The mewly held maximum levels of the respective frequency band signals and the full band signal of the input audio signal are successively displayed on the display section 26.

The multiplexer 17, as shown in FIG. 2 for example, comprises analog switches $32_1$ through $32_{n+1}$. The analog switches $32_1$ through $32_{n+1}$ are respectively supplied with decoded pulses $d_1$ through $d_{n+1}$ shown in FIG. 4 through resistors $R2_1$ through $R2_{n+1}$ from terminals $33_1$ through $33_{n+1}$. The resistors $R2_1$ through $R2_{n+1}$ are provided to keep the influence of the leak current of the control voltage from the decoder 18, on the output voltage of capacitor $C_1$ of the rectification and charging circuits 15 and 16 to a minumum, and to assure sufficient long holding time. The output signal of the terminal 34 is fed to comparators 24a through 24m.

Furthermore, as a modification of the above described embodiment, a second switch may be provided between the input terminal 11 and the buffer amplifier 12. In this case, when the second switch is opened in the above real-time level display or maximum level display state, the input signal from the input terminal 11 is not fed to band-pass filters $13_1$ through $13_n$ and 14, and the voltage across the capacitor $C_1$ is fixedly held at the voltage level when the switch is opened. This fixedly held voltage is displayed on the display section 26.

A second embodiment of the apparatus of the invention will now be described with reference to FIG. 5. In FIG. 5, those parts which are the same as corresponding parts in FIG. 1 are designated by like reference numerals. Description of such parts will not be repeated.

A switch 40 for real-time level display, a switch 41 for holding level display are interconnected to open or close in opposite relation to each other. The switch 40 is connected between switching circuits 42 and 43 and a terminal 44 of the power source +Vcc through a resistor R4. The switch 41 is connected between the switching circuits 42 and 43 and the ground through a resistor R5. The switching circuits 42 and 43 comprise electronic switching elements.

To display the level in real-time, the switch 40 is closed, and the switch 41 is opened. The voltage from the power source +Vcc is spplied to control terminals 45 and 46 of switching circuits 42 and 43, respectively, through the switch 40 and resistor R4, whereby the switching circuits 42 and 43 are closed. Upon closing of the switching circuits 42 and 43, the signal from the input terminal 11 is fed to the band-pass filters $13_1$ through $13_n$, and 14, and, by the same operation as the above first embodiment of the present invention in the real-time level display mode, the level is displayed in the display section 26.

Next, to display the holding level, the switch 40 is opened and the switch 41 is closed. The control terminals 45 and 46 of the switching circuits 42 and 43 are grounded through the switch 41, and the switching circuits 42 and 43 are opened. Upon opening of the switching circuits 42 and 43, the input signal of input terminal 11 is not fed to band-pass filters $13_1$ through $13_n$, and 14. The charging and discharging of the capacitor $C_1$ of the rectification and charging circuits $15_1$ through $15_n$, and 16 stops, and the terminal voltage is fixedly held at that voltage. The fixedly held voltage is fed to the level axis driving circuit 22 through the multiplexer 17 and the level fixedly held at that time point is display section 26.

The resistors R4 and R5 are provided to keep the influence of the leak current of the applied voltage on control terminals 45 and 46 of the switching circuits 42 and 43, on the output voltage of capacitor $C_1$ of the rectification and charging circuits $15_1$ through $15_n$ and 16 to minimum upon the opening and closing of the switches 40 and 41.

Figure 6:
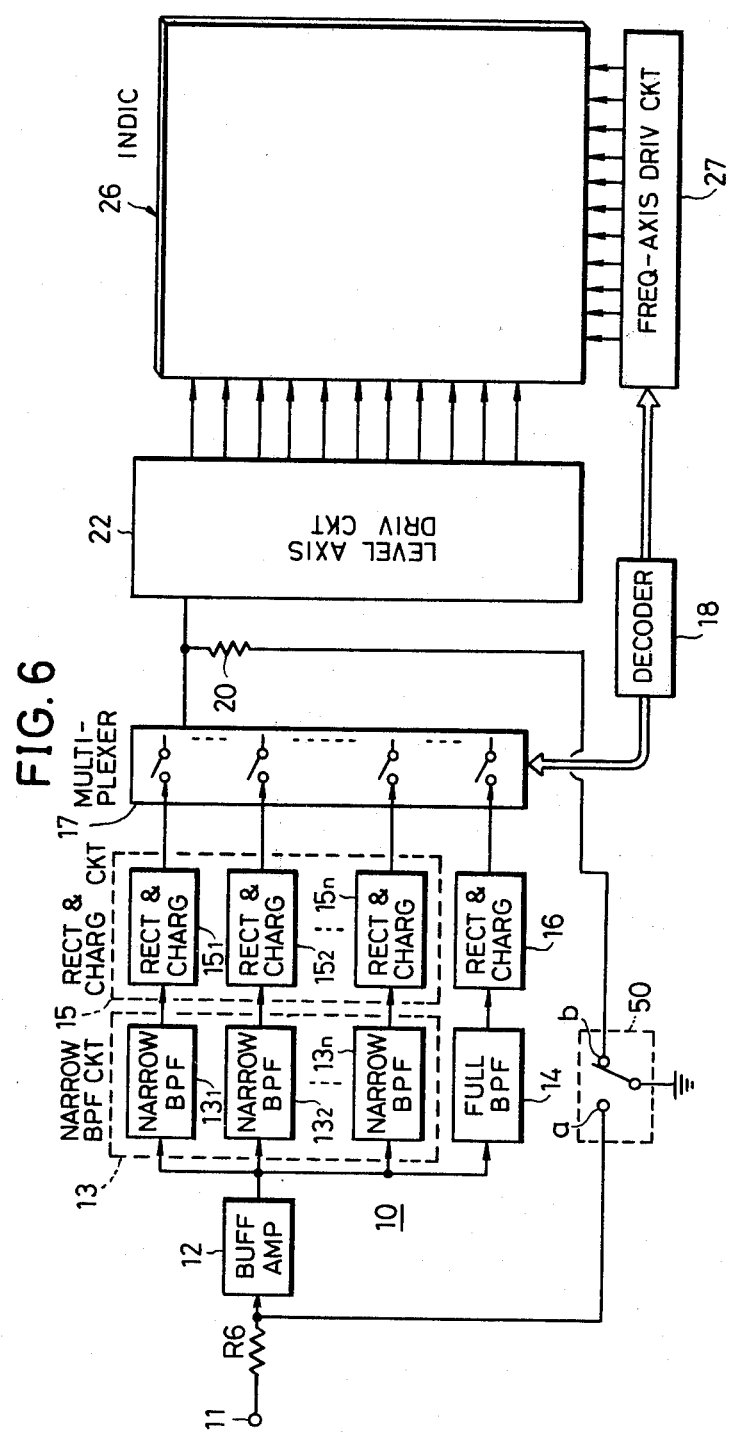
FIG. 6 is a block diagram showing a third embodiment of the signal spectrum display apparatus of the present invention.

Now, a third embodiment of the apparatus of the invention will now be described with reference to FIG. 6. In FIG. 6, those parts which are the same as corresponding parts in FIG. 1 are designated by like reference numerals. Description of such parts will not be repeated.

A switch 50 is a switch of two fixed contact points type for changing over the display mode in which a fixed contact point a is connected between a resistor R6 connected to the input terminal 11 and the buffer amplifier 12, and a fixed contact point b is connected to the resistor 20.

To display the level in real-time, the movable contact point of the switch 50 is connected to the contact point b. Here, the block diagram of this embodiment becomes identical to that shown in FIG. 1 of the first embodiment with the switch 21 closed, and the level is displayed in real-time in the display section 26.

Next, for displaying the holding level, the movable contact of the switch 50 is changed over and connected to the contact point a. By this, the input signal from the input terminal 11 is grounded through the resistor R6 and switch 50, and not fed to the band-pass filters $13_1$ through $13_n$ and 14. Thus the charging and discharging of the capacitor $C_1$ of rectification and charging circuit stops, and the voltage across the capacitor is held at the voltage of that time. Therefore, the level held fixedly is displayed in the display section 26. In this embodiment of the present invention, only a single switch 50 needs to be used, and thus has a more simple construction as that of the second embodiment where two switches 40 and 41 were used.

As a modification of the third embodiment of the present invention, a 3-contact type switch may be used instead of the 2-contact type switch 50. Here, the both side contacts are used in the same manner as the contacts a and b of the switch 50, and a middle contact is remained as a vacant contact c. When a movable contact is connected to the contact b a real-time level display is carried out. In this state, when the movable contact is changed to connect to the contact c the circuit become substantially identical to the first embodiment with the switch 21 open. The voltage across the capacitor $C_1$ of the rectification and charging circuits $15_1$ through $15_n$ and 16 is successively held at the maximum voltage, and the maximum holding level at the present is displayed successively in the display section 26.

Further, this invention is not limited to these embodiments but various variations and modifications may be made without departing from the scope of the invention.

What we claim is:

1. A signal spectrum display apparatus comprising:
   a plurality of band-pass filters respectively having filtering bands of different center frequencies and operating to filter an input signal thereby to band-divide the input signal fed through an input terminal;
   a plurality of rectification and charging circuits connected respectively to said band-pass filters, each of said rectification and charging circuits comprising a rectifying element, and a capacitor which is charged and discharged by being supplied with voltage rectified by said rectifying element;
   a display section having displaying means including the same number of display systems as band-pass filters each of said systems respectively corresponding to a band-pass filter;
   means for supplying the output signals of rectification and charging circuits to the displaying means and causing level displaying by the displaying means of those systems corresponding respectively to the output signal levels of said band-pass filters; and
   switching means connected between a point between said rectification and charging circuit and said display section, and the ground,
   said capacitor charging and discharging when said switching means is closed, whereby the input signal level is displayed in real-time in said display section, and said capacitor stopping charging and discharging when said switching means is opened, whereby the maximum input signal level is successively displayed in said display section in response to the output voltage held in response to successive higher input signal voltage.

2. A signal spectrum display apparatus as claimed in claim 1 in which said means for causing level displaying comprises time division signal emitting means for emitting time division signals successively and repeatedly corresponding to the number of said band-pass filters, time division means for time dividing and converting the output signal of said rectification and charging circuit to a serial signal in response to the time division signals fed by said time division signal emitting means, means for driving a level axis of the display section in response to the level of output signal supplied from the time division means, and means for driving a frequency axis of the display section corresponding to said band-pass filters in said display section in response to said time division signal fed by said time division signal emitting means, said switching means being connected between a point between said time division means and said level axis driving means, and the ground.

3. A signal spectrum display apparatus as claimed in claim 1 in which said switching means comprises a circuit comprising a resistor, and an open-and-close switch connected in series.

4. A signel spectrum display apparatus as claimed in claim 1 in which said switching means comprises a circuit comprising a resistor and an electronic switching circuit connected in series, and which further comprises a controlled switching means which, during the real-time level display mode, supplies a voltage to the control terminal of said electronic switching circuit to close the switching circuit, and, during the holding level display mode, causes the control terminal of said electronic switching circuit to be grounded to open said switching circuit.

5. A signal spectrum display apparatus as claimed in claim 4 which further comprises a second electronic switching circuit connected between said input terminal and said band-pass filter, said second switching circuit being opened and closed simultaneously with the electronic switching circuit of said switching means by said controlled switching means, and in which the holding level at the point of the opening of said second electronic switching circuit being fixedly displayed in said display section.

6. A signal spectrum dispaly apparatus as claimed in claim 4 in which said switching means is further connected between a point between said input terminal and said band-pass filter, and the ground, said switching means is constructed to ground selectively the point between said rectification and charging circuits and said display section, and the point between said input terminal and said band-pass filters.

7. A signal spectrum display apparatus as claimed in claim 6 in which said switching means comprises a switch having a first fixed contact connected between said input terminal and said band-pass filters, a second fixed contact connected between said rectification and charging circuit and said display section, and a movable contact of which one end is grounded and is changed over between said first and second fixed contact, said movable contact being connected to said second fixed contact during real-time display mode, and to said first fixed contact during holding level display mode.

8. A spectrum display apparatus as described in claim 7 in which said switch further comprises a third fixed contact between said first and second fixed contacts, said movable contact being connected to said third fixed contact during maximum holding level display mode.

* * * * *